United States Patent [19]

O'Connell

[11] 4,109,173

[45] Aug. 22, 1978

[54] HIGH PIEZOELECTRIC COUPLING, LOW DIFFRACTION LOSS, TEMPERATURE COMPENSATED BERLINITE SUBSTRATE MEMBERS FOR SURFACE ACOUSTIC WAVE DEVICES

[75] Inventor: Robert M. O'Connell, Arlington, Mass.

[73] Assignee: The United States of America as represented by the Secretary of the Air Force, Washington, D.C.

[21] Appl. No.: 826,108

[22] Filed: Aug. 19, 1977

[51] Int. Cl.² .............................................. H01L 41/10
[52] U.S. Cl. ..................................... 310/313; 310/360
[58] Field of Search ................... 310/313, 360; 333/72, 333/30 R; 364/821

[56] References Cited

U.S. PATENT DOCUMENTS

| 3,866,153 | 2/1975 | Slobodnik, Jr. ................. 310/313 X |
| 3,956,718 | 5/1976 | Weinert et al. ................. 310/313 X |
| 3,983,515 | 9/1976 | Mitchell et al. ................. 310/313 X |
| 4,001,767 | 1/1977 | Slobodnik, Jr. ..................... 310/313 |

Primary Examiner—Mark O. Budd
Attorney, Agent, or Firm—Joseph E. Rusz; Willard R. Matthews, Jr.

[57] ABSTRACT

Doubly rotated propagation surface defining cuts of single crystal berlinite (AlPO$_4$) are utilized to provide temperature compensated surface acoustic wave (SAW) substrates having high piezoelectric coupling factors and low diffraction losses. A preferred embodiment of the invention comprises a berlinite substrate member having a propagation surface that substantially coincides with a plane defined by Euler angles Lambda = 76.8°, mu = 90.0°, and Theta = 11.5°. An alternative embodiment utilizes a propagation surface that substantially coincides with a plane defined by Euler angles Lambda = 79.7°, mu = 90.0°, and Theta = 15.5°.

2 Claims, 10 Drawing Figures

HIGH PIEZOELECTRIC COUPLING, LOW DIFFRACTION LOSS, TEMPERATURE COMPENSATED BERLINITE SUBSTRATE MEMBERS FOR SURFACE ACOUSTIC WAVE DEVICES

STATEMENT OF GOVERNMENT INTEREST

The invention described herein may be manufactured and used by or for the Government for governmental purposes without the payment of any royalty thereon.

BACKGROUND OF THE INVENTION

The invention relates to surface acoustic wave device substrate members, and in particular to improvements in the piezoelectric coupling and diffraction loss characteristics of such devices.

Surface acoustic wave devices such as filters, delay lines, encoders, decoders, correlators and other signal processing means commonly use a standard ST cut quartz substrate. This substrate, however, has a typically low piezoelectric coupling factor. A significant problem exists then when there are required low insertion loss, temperature compensated surface acoustic wave devices having larger bandwidth than those obtainable in devices built on ST cut quartz.

Currently, lithium niobate ($LiNbO_3$) is used in surface acoustic wave devices requiring greater bandwidth (for a given amount of insertion loss) than that obtainable with ST cut quartz. However, since $LiNbO_3$ is not temperature compensated, bulky and costly ovens are required for temperature control.

Other attempts to solve the problem have met with various degrees of success. $Tl_3VS_4$, for example, has been found to be temperature compensated with substantially better piezoelectric coupling than ST cut quartz. The SAW velocity for this material, about 900 m/sec, is relatively slow, which is a disadvantage for high frequency filter applications but an advantage for long delay lines. The main drawback to the material is that the electromechanical power flow angle corresponding to the temperature compensated cut is rather large, about $-17$ degrees.

Another substrate material, a temperature compensated composite, produced by sputtering a film of silicon dioxide on YZ lithium tantalate, has been found to exhibit a very small electromechanical power flow angle, a piezoelectric coupling of about 0.007, and a relatively large SAW velocity. The most attractive feature of the material is that its second order temperature coefficient of time delay is nearly an order of magnitude smaller than that of ST cut quartz. The main drawbacks of the composite are: (1) the need to very accurately control the thickness of the $SiO_2$ film; (2) the loss in the film at high frequencies, and (3) the SAW dispersion in the film.

Other state of the art solutions are subject to the same or similar trade-offs and limitations.

A high piezoelectric coupling temperature compensated SAW substrate has been discovered and disclosed in U.S. Patent Application of Robert M. O'Connell, entitled "HIGH PIEZOELECTRIC COUPLING TEMPERATURE COMPENSATED BERLINITE SUBSTRATE MEMBER FOR SURFACE ACOUSTIC WAVE DEVICES," filed on even date herewith. Although the device disclosed therein is an improvement over prior art devices and meets the temperature compensation and piezoelectric coupling requirements, it exhibits diffraction losses that exceed those of ST cut quartz. There currently exists the need therefore for a surface acoustic wave substrate that has improved diffraction loss characteristics as well as temperature compensation and improved piezoelectric coupling. The present invention is directed toward satisfying that need.

SUMMARY OF THE INVENTION

Calculations of the surface acoustic wave properties of berlinite ($AlPO_4$) have produced two pure mode crystallographic orientations which are temperature compensated and have more than four times the piezoelectric coupling of ST cut quartz. They have, like ST cut quartz, a zero electromechnical power flow angle, but the distinct advantage of more than four times the piezoelectric coupling. The two cuts are doubly rotated and they combine the advantage of temperature compensation and high piezoelectric coupling with the added feature of having better diffraction properties than ST cut quartz. These advantages are utilized by berlinite SAW substrates having surface acoustic wave propagation surfaces that coincide with those particular crystallographic orientations. One crystallographic orientation is defined by the Euler angles Lambda = 76.8°, $\mu$ = 90.0°, and Theta = 11.5°. The other is defined by the Euler angles Lambda = 79.7°, $\mu$ = 90.0°, and Theta = 15.5°.

It is a principal object of the invention to provide a new and improved substrate member for surface acoustic wave devices.

It is another object of the invention to provide a surface acoustic wave substrate member that is temperature compensated and that has better piezoelectric coupling characteristics than ST cut quartz and other known substrates.

It is another object of the invention to provide a temperature compensated surface acoustic wave substrate member having improved piezoelectric coupling characteristics that does not require costly and bulky ovens to achieve temperature control.

It is another object of the invention to provide a temperature compensated surface acoustic wave substrate member of the type described having improved diffraction properties.

These, together with other objects, features and advantages of the invention, will become more readily apparent from the following detailed description when taken in conjunction with the illustrative embodiment in the accompanying drawings.

DESCRIPTION OF THE DRAWINGS

FIG. 6b is a detail of a portion of FIG. 6a; and

DETAILED DESCRIPTION OF THE PREFERRED EMBODIMENT

As indicated above, there currently exists the need for substrate materials that are temperature compensated and have piezoelectric coupling greater than that of ST cut quartz. A major contribution to the search for such materials has been the development of a phenomonological model which explains why known materials are temperature compensated. According to that model, temperature compensated materials possess either of the following anomalous properties: (1) a positive temperature coefficient of velocity or elastic constant, or (2) a negative coefficient of thermal expansion. Quartz, for example, is temperature compensated because the temperature coefficient of $C_{66}$, the elastic constant for shear propagation along the Z axis, is positive.

Berlinite, $AlPO_4$, is structurally similar to quartz with larger piezoelectric constants. It has been shown that for bulk waves berlinite is indeed temperature compensated along orientations similar to the AT and BT cuts of quartz, but with 2.5 times larger piezoelectric coupling. Motivated by these results for bulk waves and the fact that the temperature coefficient of one of berlinite's elastic constants is positive, an investigation of the behavior of surface acoustic waves (SAW) on berlinite has produced several temperature compensated cuts with more than four times the piezoelectric coupling of ST cut quartz.

Figure 1:
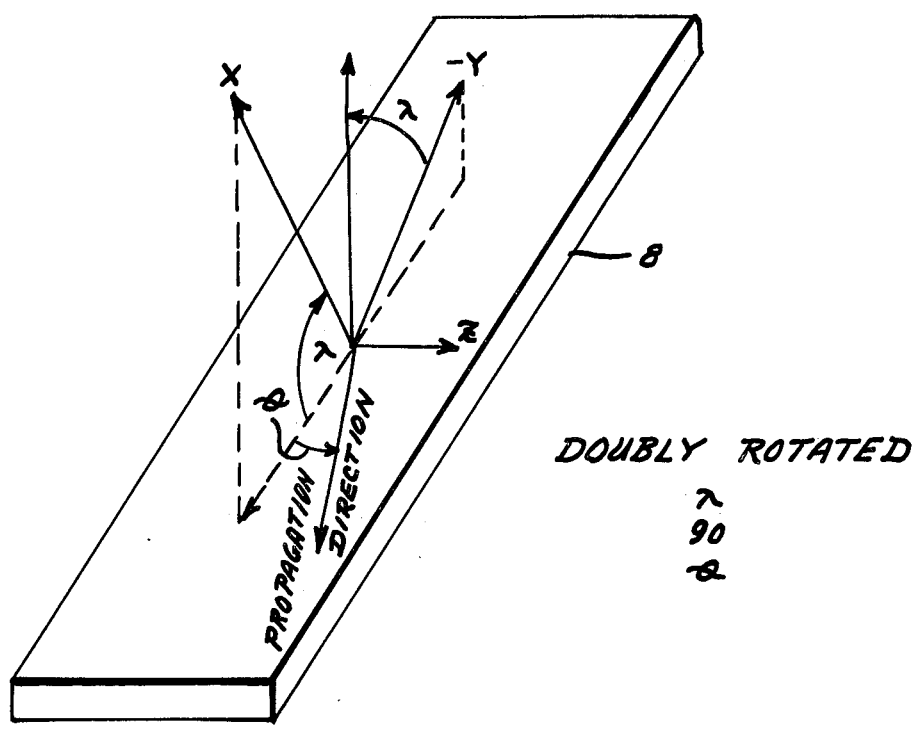
FIG. 1 illustrates a surface acoustic wave device substrate member of the type comprehended by the invention.
Figure 7A:
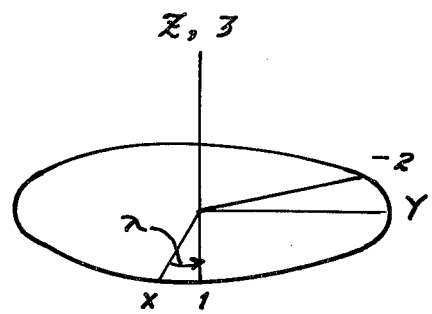
FIGS. 7a, 7b, and 7c illustrate the coordinate system used to define acoustic surface wave propagation in terms of Euler angles.
Figure 7B:
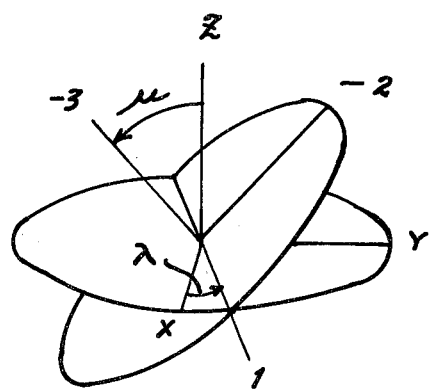
Figure 7C:
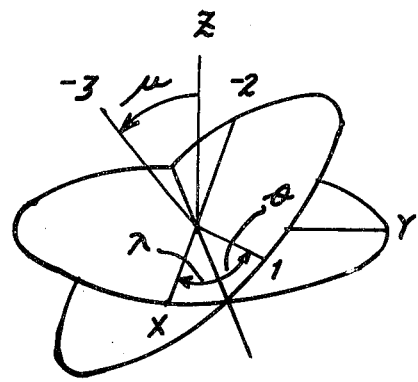

The substrate members comprehended by the present invention utilize two such berlinite cuts identified as doubly rotated $\mu = 90.0°$ cuts. FIG. 1 illustrates the substrate member 8 of the invention indicating the crystallographic cut in Euler angles. One cut comprehended by the invention is defined by the Euler angles Lambda $= 76.8°$ $\mu = 90.0°$, and Theta $= 11.5°$. The other cut is defined by the Euler angles Lambda $= 79.7°$, $\mu = 90.0°$, and Theta $= 15.5°$. Euler angles are described in FIGS. 7a, 7b and 7c.

To establish a given crystallographic orientation, the propagation axes 1, -2, -3 are transformed relative to the crystalline axes X, Y, Z with which they are initially aligned, by means of three successive rotations performed in a specific sequence. The angles of the rotations in this sequence are defined as the Euler angles.

The transformation sequence begins by rotating the 1 and -2 axes counterclockwise about the Z axis through angle $\lambda$. Next, the -2 and -3 axes are rotated counterclockwise about the 1 axis and through angle $\mu$. Finally, the 1 and -2 axes are rotatated counterclockwise about the -3 axis through angle $\theta$. The resultant direction of the 1 axis defines the phase velocity vector or the direction of propagation and the resultant direction of the -3 axis defines the plate normal.

Figure 2:
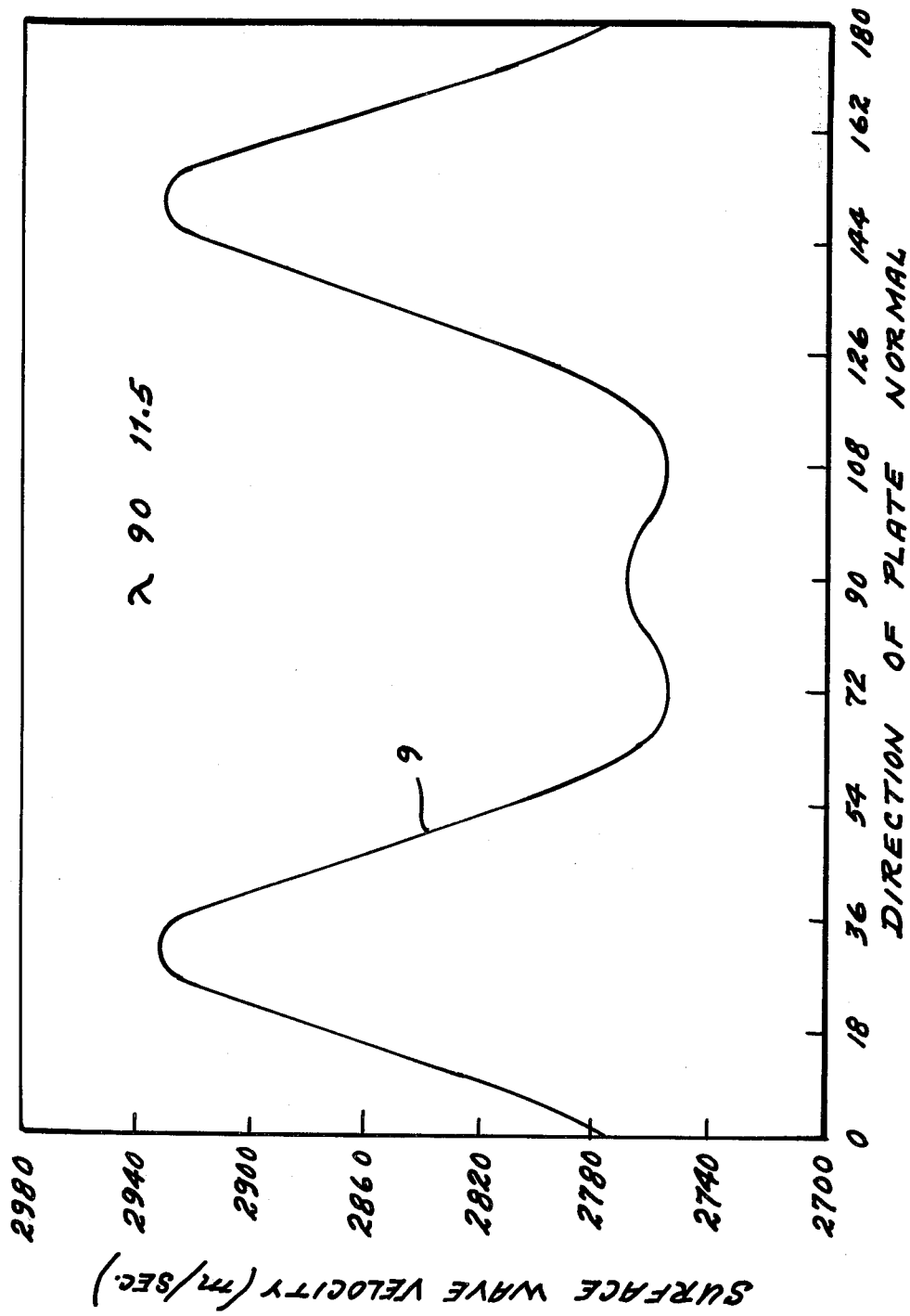
FIG. 2 is a curve illustrating the variation of SAW velocity for a cut of berlinite parallel to the Z-axis cylinder and passing through one of the doubly rotated cuts comprehended by the invention.
Figure 3:
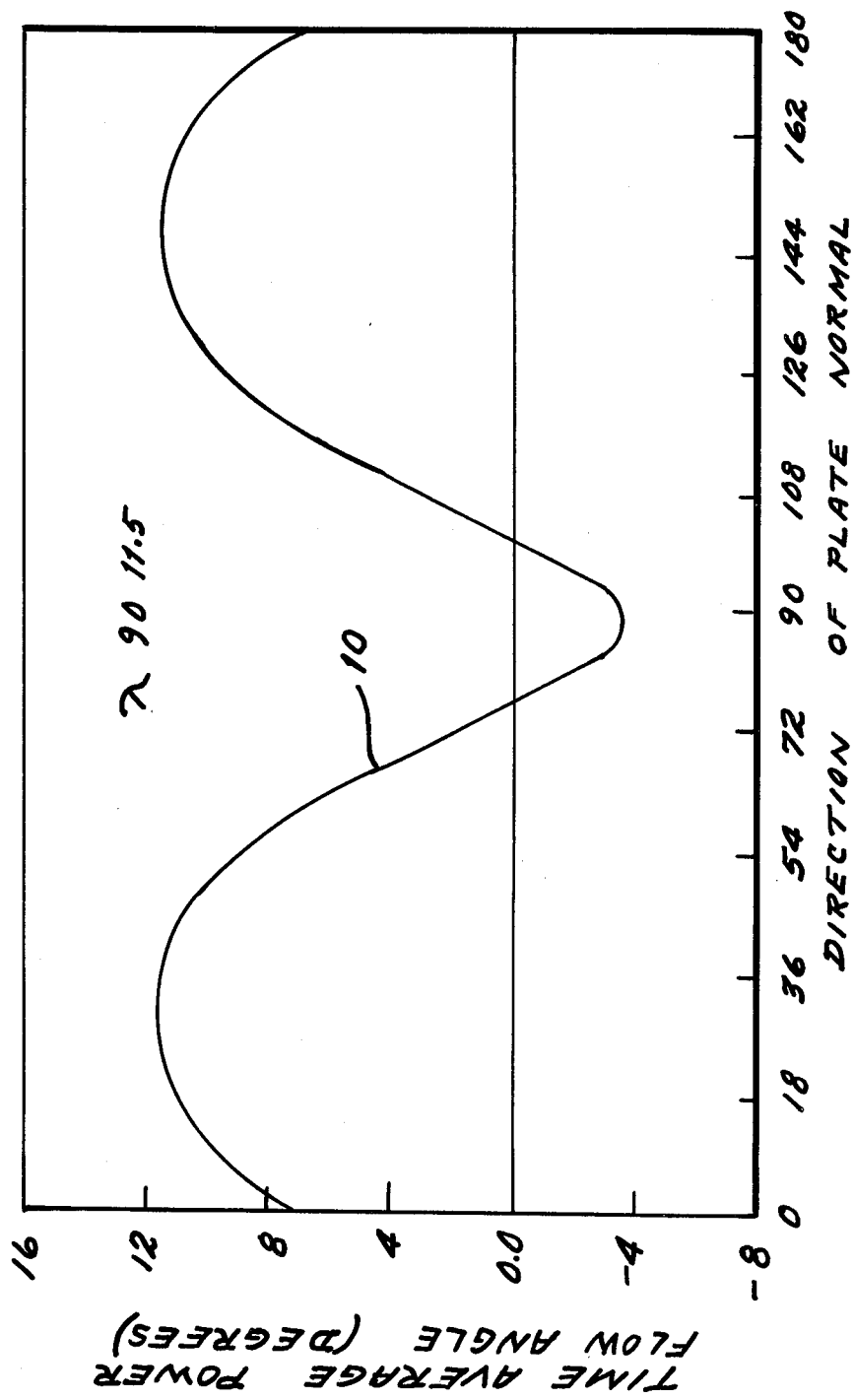
FIG. 3 is a curve illustrating the electromechanical power flow angle for the cut of FIG. 2.
Figure 4:
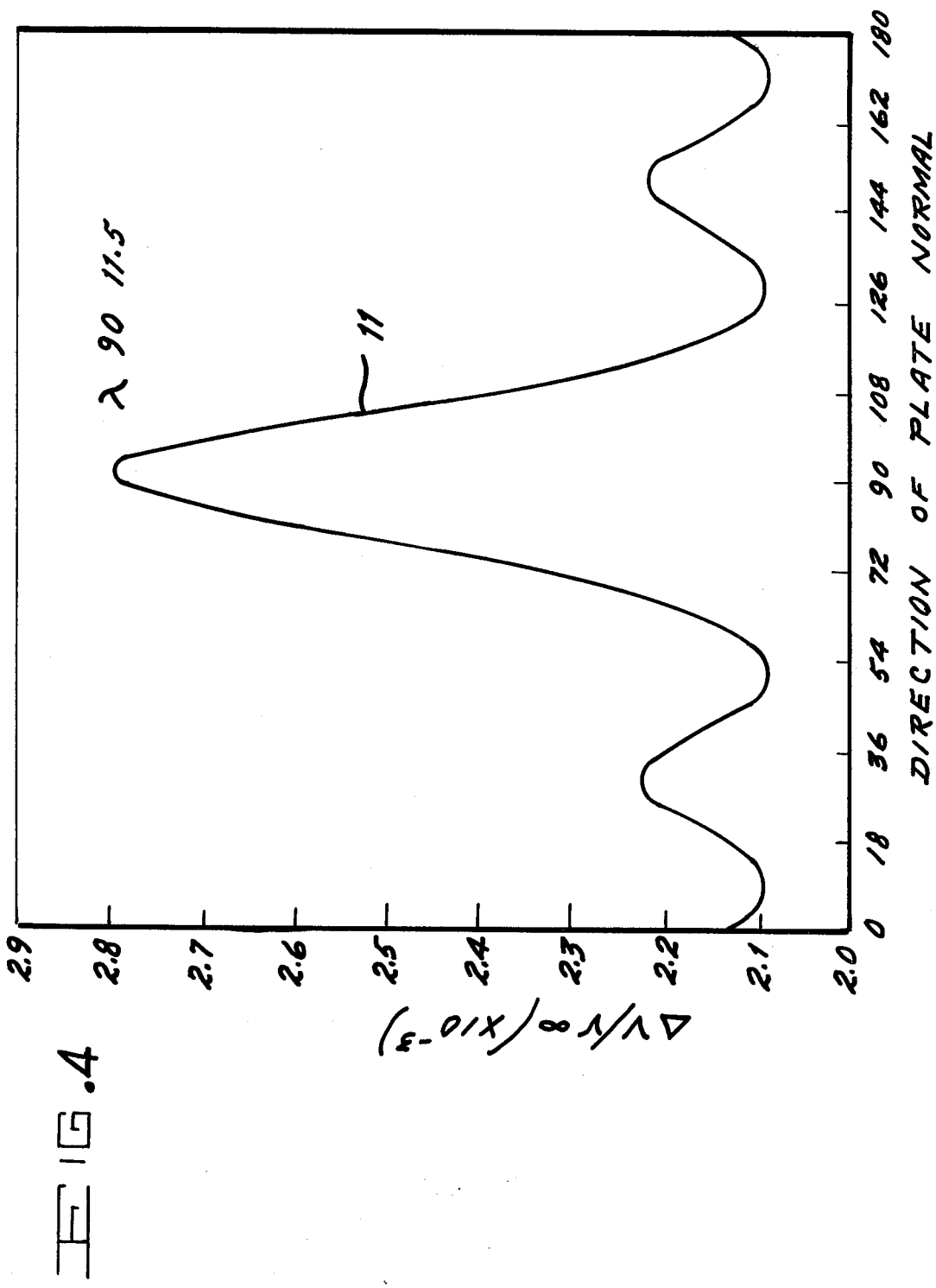
FIG. 4 is a curve illustrating the piezoelectric coupling for the cut of FIG. 2.
Figure 5:
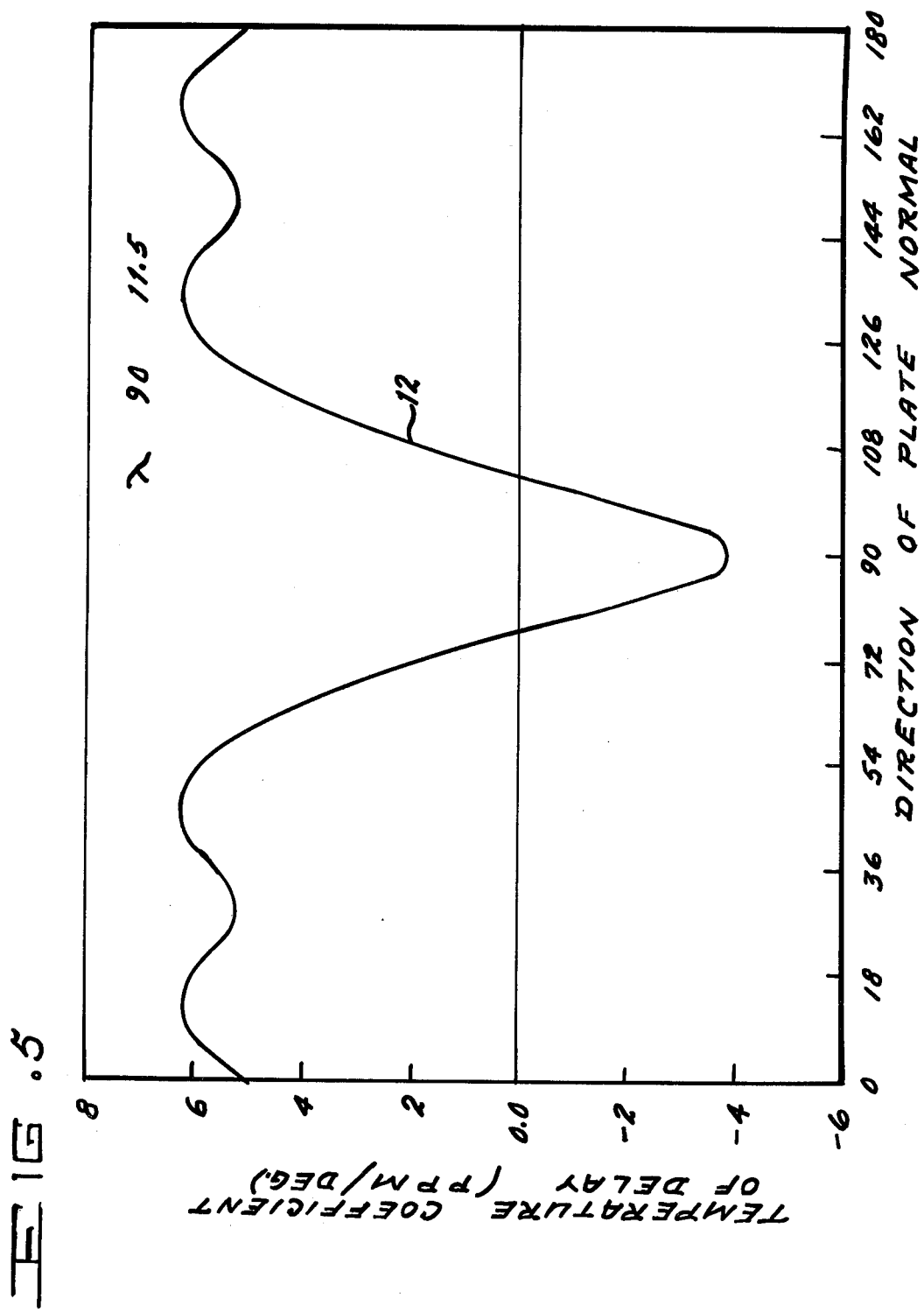
FIG. 5 is a curve illustrating the temperature coefficient of time delay for the cut of FIG. 2.

Having reference to the $\lambda$, $\mu = 90.0°$, $\theta = 11.5°$ cut the variation of surface wave velocity is illustrated by curve 9 of FIG. 2; the electromechanical power flow angle is illustrated by curve 10 of FIG. 3; the piezoelectric coupling is illustrated by curve 11 of FIG. 4; and, the temperature coefficient of time delay is illustrated by curve 12 of FIG. 5. The corresponding curves for the doubly rotated cut $\lambda$, $\mu = 90.0°$, $\theta = 15.5°$ are similar.

Figure 6A:
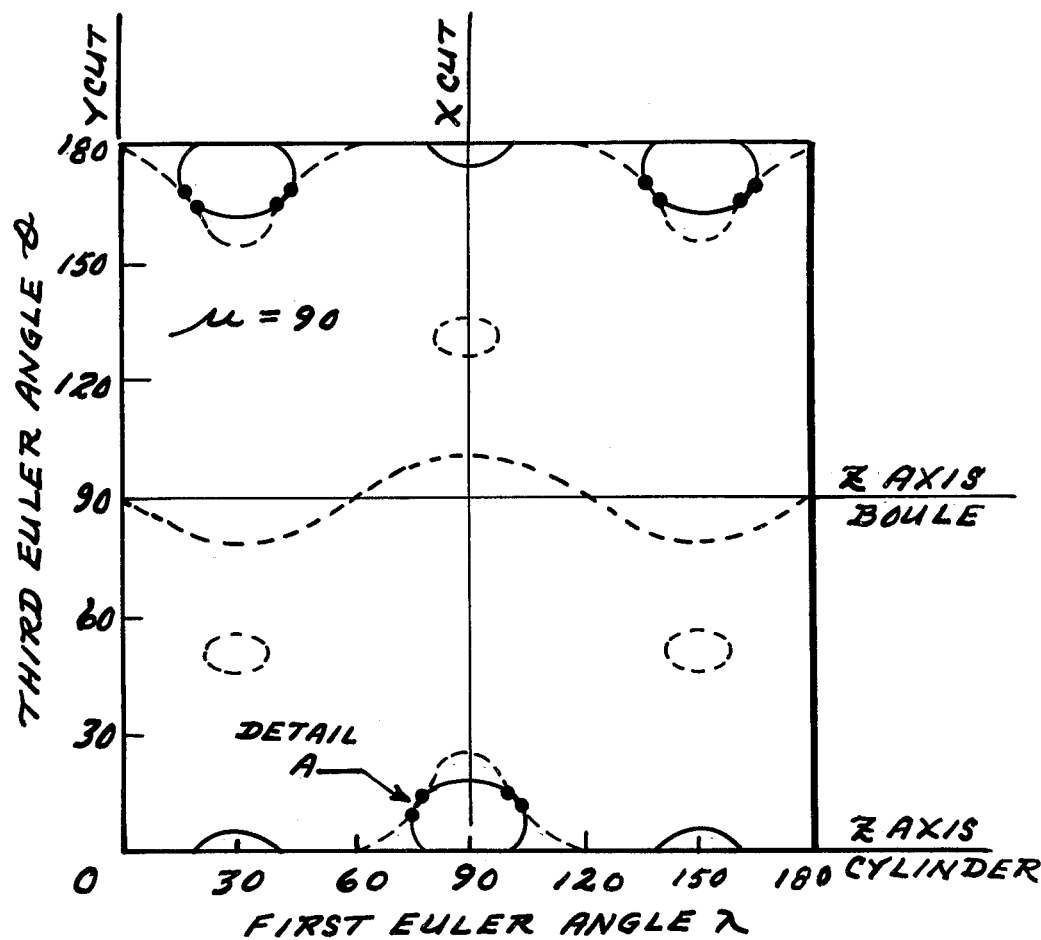
FIG. 6a illustrates the loci of Euler angles having zero electromechanical power flow angle (dashed lines) and zero temperature coefficient of time delay (solid lines) in the $\mu = 90.0°$ plane of berlinite cut in accordance with the principles of the invention.
Figure 6B:
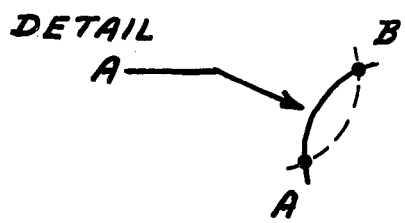

Referring now to FIGS. 6a and 6b, the dashed and solid curves represent respectively the loci of Euler angles for which the electromechanical power flow angle and the temperature coefficient of time delay are zero. As can be seen in the blown-up detail of FIG. 6b, the loci intersect in a total of twelve places throughout the plane. Because of crystal symmetry, however, only two of the points are independent. Accordingly, the invention is defined in terms of the two points shown in Detail A. The cuts defined by these angles however, are the same as and are interchangeable with cuts defined by the other indicated loci intersections and it is intended that the cuts defined in the appended claims be taken to include all such crystallographic image orientations.

As can be seen from FIG. 6a, an independent temperature compensated cut for doubly rotated berlinite coincides with a plane defined by the Euler angles Lambda $= 76.8°$, $\mu = 90.0°$, and Theta $= 11.5°$. For this cut the corresponding value of the electromechanical power flow angle ($\phi$ in degrees) is 0.0°; the slope of the electromechanical power flow angle ($\delta\phi/\delta\theta$) is 0.372; the piezoelectric coupling ($\Delta V/V \infty$) is $0.250 \times 10^{-2}$; and the SAW velocity is 2756 m/sec. The other independent temperature compensated cut coincides with a plane defined by the Euler angles Lambda $= 79.7°$, $\mu = 90.0°$, and Theta $= 15.5°$. For this cut the corresponding values of the electrical power flow angles ($\phi$ in degrees is 0.0), the slope of the electromechanical power flow angle ($\delta\phi/\delta\theta$) is 0.221; the piezoelectric coupling ($\Delta V/V \infty$) is $0.247 \times 10^{-2}$; and the SAW velocity is 2758 m/sec.

While the invention has been described in terms of its preferred embodiments, it is understood that the words which have been used are words of description rather than words of limitation and that changes within the purview of the appended claims may be made without departing from the scope and spirit of the invention in its broader aspects.

What is claimed is:

1. A surface acoustic wave device substrate member of single crystal berlinite having an acoustic surface wave propagation surface that substantially coincides with the Euler angles Lambda $= 76.8°$, $\mu = 90.0°$, and Theta $= 11.5°$.

2. A surface acoustic wave device substrate member as defined in claim 1 wherein said Lambda Euler angle is 79.7° and said Theta Euler angle is 15.5°.

* * * * *